(12) United States Patent
Onde

(10) Patent No.: US 6,636,094 B2
(45) Date of Patent: Oct. 21, 2003

(54) METHOD FOR THE GENERATION OF PULSE-WIDTH-MODULATED SIGNALS AND ASSOCIATED SIGNAL GENERATOR

(75) Inventor: Vincent Onde, Fuveau (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 10/126,494

(22) Filed: Apr. 19, 2002

(65) Prior Publication Data

US 2002/0180546 A1 Dec. 5, 2002

(30) Foreign Application Priority Data

Apr. 20, 2001 (FR) .......................... 01 05340

(51) Int. Cl.[7] .............................. H03K 3/017
(52) U.S. Cl. ....................... 327/172; 327/170
(58) Field of Search ............... 327/172, 170, 327/173, 174, 175, 176

(56) References Cited

U.S. PATENT DOCUMENTS

| | | | |
|---|---|---|---|
| 4,099,109 A | 7/1978 | Abbondanti | ............ 318/227 |
| 4,502,024 A | 2/1985 | Nishikawa et al. | ......... 332/9 R |
| 4,742,441 A | 5/1988 | Akerson | ..................... 363/97 |
| 5,535,376 A * | 7/1996 | Catherwood et al. | ....... 713/502 |
| 5,647,387 A * | 7/1997 | Tsutsui | ........................ 137/1 |
| 5,886,555 A | 3/1999 | Bildgen et al. | ............. 327/175 |
| 6,023,199 A | 2/2000 | Cheung | ..................... 332/109 |
| 6,421,382 B1 * | 7/2002 | Hayakawa | .................. 375/238 |

FOREIGN PATENT DOCUMENTS

| | | | | |
|---|---|---|---|---|
| EP | 0868028 A2 * | 9/1998 | ............ | H03K/7/08 |
| WO | 97/44899 | 11/1997 | ............ | H03K/7/08 |

* cited by examiner

Primary Examiner—Timothy P. Callahan
Assistant Examiner—Cassandra Cox
(74) Attorney, Agent, or Firm—Lisa K. Jorgenson; Allen, Dyer, Doppelt, Milbrath & Gilchrist, P.A.

(57) ABSTRACT

A pulse-width-modulated signal is generated out of a sampled reference signal. The least significant bits of a sample of the reference signal are stored in a comparison register. At the same time, a check is made in a test circuit to find out if the sample considered corresponds to a maximum amplitude of the reference signal. If this is the case, an overflow bit is given. The overflow bit and the least significant bits of the sample considered are then linked together to obtain a comparison word. The comparison word is compared with a number given by the counter to generate the pulse-width-modulated signal.

23 Claims, 2 Drawing Sheets

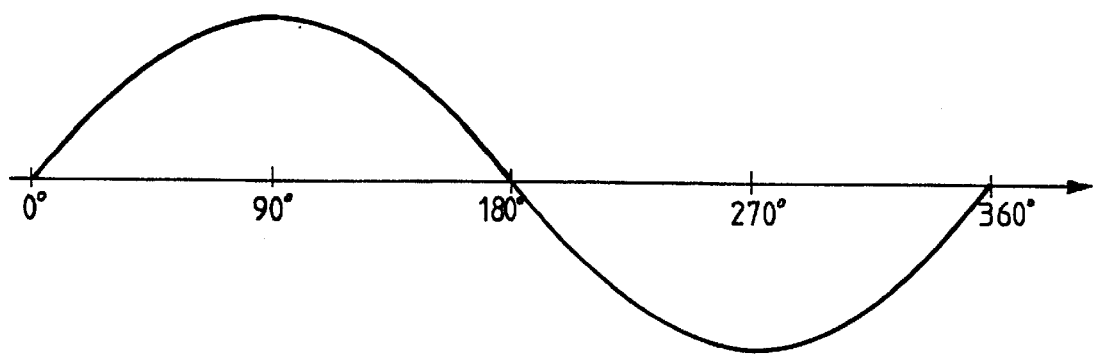
FIG_1a
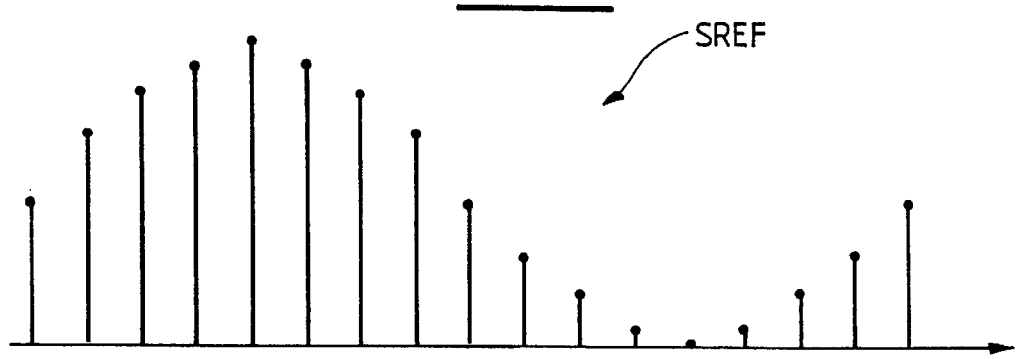
FIG_1b
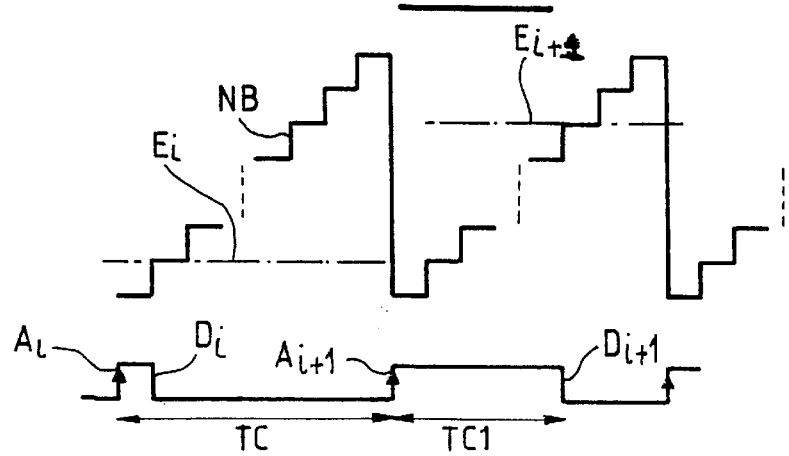
FIG_1c

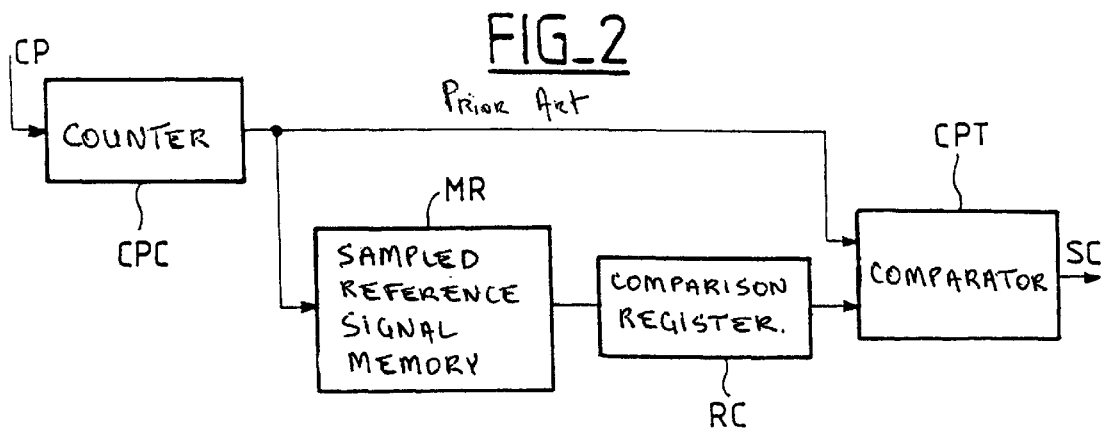
FIG_2 Prior Art
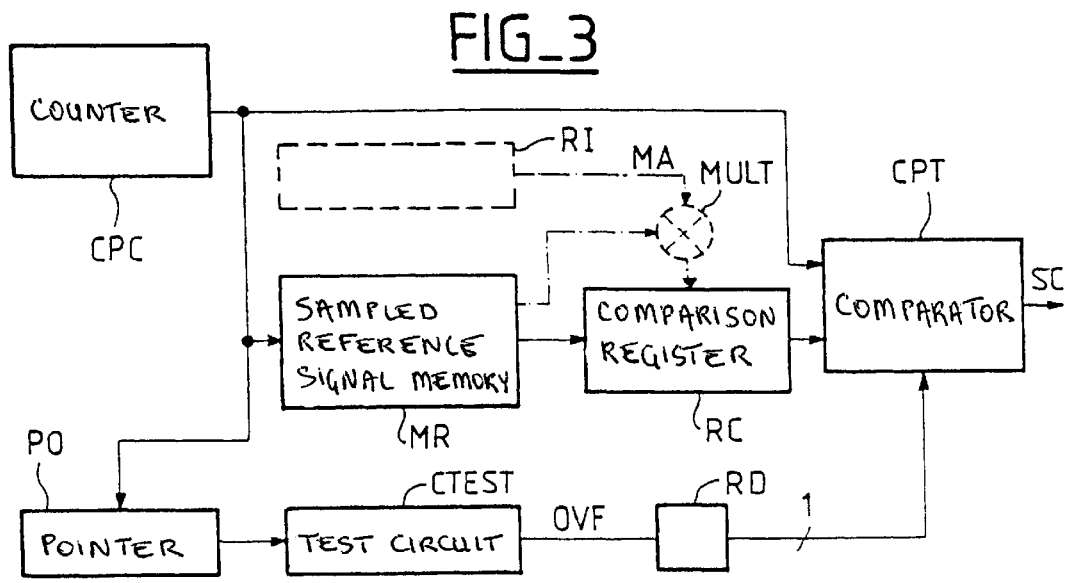
FIG_3
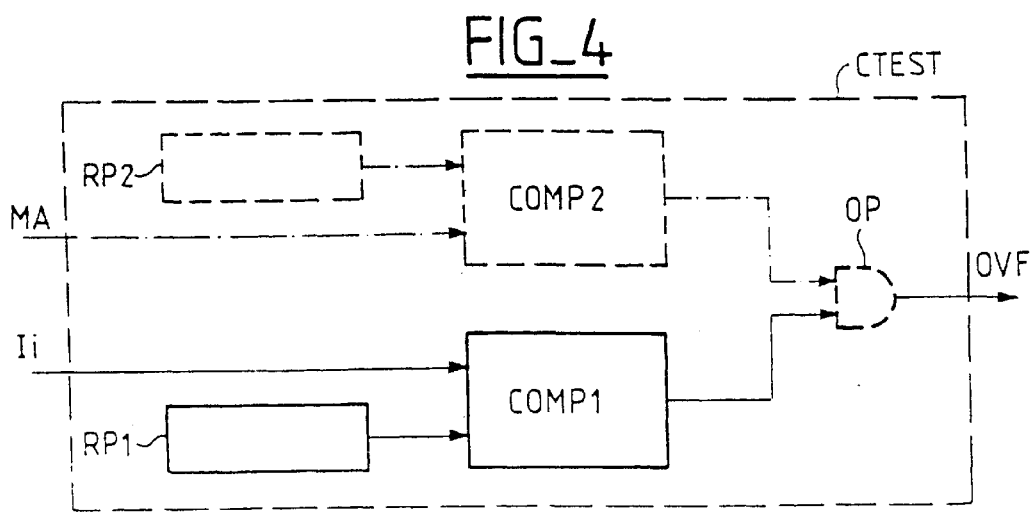
FIG_4

METHOD FOR THE GENERATION OF PULSE-WIDTH-MODULATED SIGNALS AND ASSOCIATED SIGNAL GENERATOR

FIELD OF THE INVENTION

The present invention relates to pulse-width-modulated (PWM) signals.

BACKGROUND OF THE INVENTION

Pulse-width-modulated signals are useful, for example, for the control of asynchronous motors or inverters used in household appliances, ventilation air control systems, pumping systems and the like. A pulse-width-modulated signal SC (FIG. 1c) is a cyclical signal that is activated periodically ($A_i$, $A_{i+1}$), and deactivated at variable points in time ($D_i$, $D_{i+1}$) between two operations of activation. The time TC between two operations of activation is called a switching period. The ratio TC1/TC between the duration of the active signal and the switching period is called a cyclical ratio. The signal SC may be active at 0 or at 1.

When a pulse-width-modulated signal is used to control an asynchronous motor, the variations in time of the cyclical ratio of the control signal lead to similar variations in current in the phase or phases of the motor. For example, with an appropriate control signal SC, sinusoidal variations of the current can be obtained in the phase or phases of the motor.

A pulse-width-modulated signal SC is conventionally obtained by a generator that produces the signal SC from a reference signal SREF which is a sampled analog signal. The initial analog signal may have a sine (FIG. 1a), trapezoidal, square or any other shape. The sample reference signal SREF (FIG. 1b) is obtained by the sampling of the initial analog signal. It comprises a set of binary numbers $E_0$ to $E_{NBECH}$ whose value depends on the amplitude of the signal at the instant considered. The smallest value of the numbers $E_0$ to $E_{NBECH}$, for example, equal to 0, is associated with the sample having the smallest amplitude. Conversely, the highest value of the numbers $E_0$ to $E_{NBECH}$ is associated with the greatest amplitude of the initial signal.

The number of signals chosen NBECH is a compromise between the desired precision (which increases with the number of samples) and the computation time needed to obtain the signal SC from the sampled reference signal SREF (which also increases with the number of samples). For example, in the case of an initial sine analog signal, it could be chosen to take 360 samples, i.e., every 1° on a period TREF=360° of the analog signal, or else $2^N$ samples every $TREF/2^N$ on a period TREF of the analog signal, with N being the size of a register of the circuit.

A known generator of pulse-width-modulated signals is shown in FIG. 2. The generator has a counter CPC, a reference memory MR, a comparison register RC and a comparator CPT. The numbers $E_0$ to $E_{NBECH}$ are stored in the reference memory MR of the generator. The M-bit counter CPC counts pulses of a clock signal CP and gives a number of counted pulses NB varying between 0 and NBMAX=$2^M$-1. When the number NBMAX is reached, the counter returns to zero and then starts counting again.

The samples $E_0$ to $E_{NBCH}$ of the sampled reference signal SREF contained in the reference memory MR are successively loaded into the comparison register RC. A sample $E_i$ is loaded at each return to zero of the counter CPC. As the case may be, the same sample $E_i$ may be loaded several times successively. In every case, a loading is done at each return of the counter to zero.

The comparator CPT continuously compares the number NB given by the counter with the sample $E_i$ contained in the comparison register RC. The comparator CPT gives the control signal SC having the following properties. For every value of i ranging from 0 to NBECH, SC is active when NB<$E_i$, and SC is inactive when NB≧$E_i$.

FIG. 1c shows the development of the number NB, the samples $E_i$ and the signal SC resulting in one example. The signal SC is active at 1 and inactive at 0. The signal SC is thus activated at each return to zero of the counter, and then deactivated when the number NB given by the counter exceeds the value $E_i$ of the sample contained in the comparison register RC.

Referring to FIG. 1C, a pulse signal is obtained. In this signal, the width of the active pulses (and hence the cyclical ratio) varies in time as a function of the value $E_i$ of the samples of the reference signal SREF, and hence as a function of the initial analog signal. The precision of the generator depends on the range of variation of the cyclical ratio and on the minimum variation of the cyclical ratio.

The cyclical ratio R of the control signal SC can be computed as follows. For each period TC of the counter (since the signal SC is activated at each return to 0 of the counter):

$$R = (E_i^* TCP)/(TC)$$
$$= (E_i^* TCP)/((NBMAX+1)^* TCP)$$
$$= E_i/(NBMAX+1).$$

NBMAX=$2^M$-1 is the maximum value of the number NB, M is the size of the counter, and TCP is the period of the clock signal CP.

The minimum variation in the cyclical ratio is equal to ΔRmin=1/(NBMAX+1). The precision of the generator is directly proportional to the number NBMAX, namely the size of the counter. The precision of the generator increases also with the range of variation of the cyclical ratio. It is preferable to have available a generator producing control signals whose cyclical ratio varies from 0 to 100% to have as wide a range of control as possible. In this way, unnecessary losses and deterioration are avoided in the electronic control circuits of the motor.

The minimum value Rmin of the cyclical ration is equal to 0%. This corresponds to $E_i$=0.

The maximum value of the cyclical ratio is equal to:

$$Rmax=X/(NBMAX+1).$$

X is the maximum value of the numbers $E_0$ to $E_{NBCH}$. Rmax can reach 100% only if X can reach the value NBMAX+1=$2^M$, with M being the size of the counter. To attain a cyclical ratio of 100%, the numbers $E_0$ to $E_{NBCH}$ should be encoded on a number of bits at least equal to M+1 to be able to reach the value $2^M$.

If the register RC used has a size N (for example, N=16) greater than the size M (for example, M=12) of the counter CPC, this does not raise any problems. It is possible to use 13-bit numbers $E_i$ which are loaded into the register RC and then are compared with the 12-bit numbers NB given by the counter. It is also possible to use 16-bit numbers $E_i$ (enabling higher precision to be obtained on the sampled signal). These numbers are loaded into the register RC, and only the 13 most significant bits of the numbers $E_i$ are compared with the 12-bit numbers NB given by the counter CPC.

A problem arises, however, when the registers and the counter have an identical size. A first known approach uses two comparison registers, the first to store the N least significant bits of the numbers $E_0$ to $E_{NBCH}$, and the second to store the most significant bits of these numbers. This approach, however, is not worthwhile because it implies the loading of two registers at each return of the counter to zero. This increases the time for loading the numbers $E_i$, and therefore the time for computing the signal SC. Furthermore, the size of the circuit is increased.

In a second approach, only the M−1 least significant bits of the counter CPC are used to produce the M−1 bit numbers NB, and the register RC sized N=M is used to store the numbers $E_0$ to $E_{NBCH}$. It is thus possible to attain a cyclical ratio Rmax equal to 100%. This approach, however, is not worthwhile because it impairs the performance of the generator by reducing its precision (the number ΔRmin increases).

Thus, if the registers and the counter of the generator are identical in size, it is not possible, with the prior art approaches, to obtain an optimum generator that has both maximum precision and minimum computation time.

SUMMARY OF THE INVENTION

In view of the foregoing background, an object of the present invention to provide an optimized generator making the most efficient use of the capacities of its components while at the same time maintaining high precision and limited computation time.

This and other objects, advantages and features according to the present invention are provided by a method for the generation of a pulse-width-modulated signal out of a sampled reference signal, a method in which a counter is incremented to produce numbers NB incremented at each pulse of a clock signal. A reference number is updated each time the counter reaches a setting value. The reference number relates to the reference signal.

According to the method of the invention, the following steps are also performed. An overflow bit is computed by comparing a pointer value with a reference parameter. The pointer value is updated each time the counter reaches the setting value. The control signal is produced by comparing a number NB given by the counter with an updated comparison word comprising the overflow bit in terms of the most significant bits, and the updated reference number in terms of the least significant bits.

The invention also relates to an associated generator of pulse-width-modulated signals. The generator comprises a counter to count the pulses of the clock signal and provide the numbers NB. A comparison register stores the reference number.

According to the invention, the generator also comprises a test circuit to compute the overflow bit, and an overflow register to store the overflow bit. A comparator gives the control signal by comparing the number NB given by the counter with the updated comparison word comprising the overflow bit in terms of most significant bits and the updated reference number in terms of least significant bits.

The numbers NB given by the counter and the updated reference number are of the same size N. The updated comparison word is a sample of the reference signal associated with the value of the updated pointer. The pointer indicates the sampling times. The updated reference number is obtained by eliminating the most significant bit of the sample of the reference signal associated with the updated pointer value.

According to one variation, the reference parameter is a pointer value for which the associated sample of the reference signal has maximum amplitude. According to another variation, the reference parameter is a set comprising several pointer values. The sample of the reference signal associated with each of the pointer values has a maximum amplitude.

In general, as will be seen more clearly below, the reference parameter is chosen as a function of the following. The number of samples of the reference signal, the type of increment used to update the pointer value, and the shape of the initial analog signal.

Thus, with the invention, the N least significant bits of a sample of the reference signal are stored in the comparison register. At the same time, it is verified in a test circuit that the sample considered corresponds to maximum amplitude of the reference signal and, if this is the case, an overflow bit is given. The overflow bit and the N least significant bits of the sample considered are then linked together to obtain the comparison word. The comparison word is then compared with the number NB given by the counter.

Thus, when the counter and the comparison register have the same size, it is possible with the invention to use all the bits of the counter without its being necessary to use two comparison registers to store the sample of the reference signal.

According to one embodiment of the generator, the test circuit comprises a comparator with two inputs to which the reference parameter and the updated pointer value are applied respectively, and an output is connected to the overflow register. According to another embodiment, the test circuit comprises software means to compare the reference parameter with the updated pointer value.

The generator described above may be used to control a monophase device, for example, of the motor or inverter type. If the device is a triphase device, the invention will preferably use a control circuit comprising three generators as described above, operating in parallel but preferably using a single common counter.

BRIEF DESCRIPTION OF THE DRAWINGS

The invention will be understood more clearly and other features and advantages shall appear from the following description of an exemplary implementation of the method and a signal generator according to the invention. The description must be read with reference to the appended figures, of which:

FIGS. 1a to 1c are graphs of an analog signal, a sampled reference signal and the pulse-width-modulated control signal according to the prior art;

FIG. 2 is a functional diagram of a generator of pulse-width-modulated signals according to the prior art;

FIG. 3 is a functional diagram of a generator of pulse-width-modulated signals according to the present invention; and FIG. 4 is an exemplary embodiment of the test circuit illustrated in FIG. 3.

DETAILED DESCRIPTION OF THE PREFERRED EMBODIMENTS

In all the figures, identical references designate the same object. Similarly, the generator according to the invention comprises (FIG. 3), like a known generator, a counter CPC, a reference memory MR, a comparison register RC and a comparator CPT. The generator according to the invention also has a pointer PO, a test circuit CTEST and an overflow register RD.

The generator is integrated into a microprocessor using N=8 bit registers and instructions, such as register loading instructions adapted for use with such registers. The initial analog signal chosen is, in this case, a sine signal, such as the one shown in FIG. 1. The signal is sampled on 36 points for a period of the reference signal SREF. Each sampling point $I_i$ has an associated number $E_i$ representing the amplitude of the initial analog signal at the point $I_i$, with i ranging from 0 to NBECH=35. The reference signal is sampled so that the 36 numbers $E_0$ to $E_{NBECH}$ range from 0 to $2^N=256$. A number $E_i$ is equal to zero if the amplitude of the reference signal is minimal ($E_{27}$ in the example), and a number $E_i$ is equal to 256 if the amplitude of the reference signal is maximum ($E_9$ in the example).

The counter CPC is an N=8 bit counter having a clock input to receive a clock signal CP, and a data output. The counter CPC counts pulses of the clock signal CP. At its data output, it gives numbers NB ranging from 0 to NBMAX= $2^8-1=255$. When it reaches its maximum value NBMAX, the counter CPC returns to zero, and then continues counting the pulses of the clock signal. The passage to zero of the counter CPC is used as a control signal for the reference memory MR and the pointer PO.

The pointer PO has a control input connected to the output of the CPC counter, and a data output. The pointer PO gives a number (N=8 bits) ranging from 0 to NBECH, whose value is incremented at each return of the counter to zero. NBECH+1 is the number of samples used, which is 36. The pointer PO thus produces numbers $I_0=0$, $I_1=1$, etc. Since the reference signal is sampled on 36 points, $I_0$ corresponds to a phase of 0°, $I_i$ corresponds to a phase of i*10°, ..., and $I_{NBECH}$ corresponds to a phase of 350°.

The reference memory MR comprises a list of NBECH+1 integers $E'_0$ to $E'_{NBECH}$ associated with the numbers $I_0$ to $I_{NBECH}$ given by the pointer. For all values of i, the number $E'_i$ is equal to N least significant bits of the number $E_i$. Thus, the most significant bit of the numbers $E_0$ to $E_{NBECH}$ is not stored in the memory MR.

Since the sampled reference signal SREF represents a sine signal, such as that of FIG. 1a, and since the number of samples chosen is equal to 36, the value $E_i=256$ is attained only for i=9, which corresponds to a 90° phase. In other words, the most significant bit of the numbers $E_0$ to $E_{NBECH}$ is zero except for that of the number $E_9$.

The memory MR has an input command connected to the data output of the counter CPC, and a data output. When the counter goes to 0 for the $i^{th}$ time, the memory MR gives the number $E'_i$ at its data output. The comparison register RC is an N=8 bit register comprising a data input connected to the data output of the memory MR and to a data output. The comparison register RC successively stores the numbers $E_0'$ to $E'_{NBECH}$, with a number E'i being stored at each return to zero of the counter CPC.

The test circuit CTEST has a data input connected to the output of the pointer PO, and a data output connected to a data input of the overflow register RD. The circuit CTEST produces a signal OVF. The register RD is a one-bit register. The register RD may also be one bit of an N-bit register identical to the register RC. The circuit CTEST compares the number $I_i$ given by the pointer PO with a predetermined parameter PARA, which is a number having the same size as the given number $I_i$.

If the number given by the pointer PO is equal to the parameter PARA, then the circuit CTEST gives the signal OVF equal to a logic 1. Conversely, if the number $I_i$ is different from the number PARA, then the circuit CTEST gives the signal OVF equal to a logic 0. The result of the comparison is stored in the register RD.

The number PARA is chosen as a function of the reference signal chosen, and of the pointer PO chosen. The number PARA indicates the index i for which the number $E_i$ is the maximum, equal here to $2^N=256$. Here, the number PARA is equal to 9, because as shown above, the index i=9 corresponds to a 90° phase and a number $E_9=256$.

The comparator CPT has two N-bit data inputs respectively connected to the output of the counter CPC, and to the output of the comparison register RC. The comparator CPT has a one-bit data input connected to the output of the overflow register RD, and has a data output at which the pulse-width-modulated control signal SC is given.

The circuit CPT compares the number NB given by the counter CPC with an N+1 bit comparison word $MC_i$ comprising, in least significant bits, the N bits of the number $E'_i$ contained in the comparison register RC, and in most significant bits, the contents of the register RD. The comparison word $MC_i$ is equal to the number $E_i$ relative to the sample. If $I_i \neq 9$, then the value of the contents of the register RD is equal to zero and the word $MC_i$ is equal to "0 $E'_i$", namely $E_i$. If $I_i=9$, then the value of the contents of the register RD is equal to 1 and the word $MC_i$ is equal to "1 $E'_9$", namely equal to $E_9$.

The circuit CPT finally gives the signal SC=0 if $NB \geq MC_i$, and SC=1 if $NB<MC_i$. The signal SC given by the pulse-width modulated signal generator according to the invention is identical to the signal SC produced by a known equivalent generator since the words $MC_i$ are identical to the numbers $E_0$ to $E_{NBECH}$.

An exemplary embodiment of the circuit CTEST is shown in FIG. 4. It comprises an adequately sized register RP1 to store the parameter PARA, and a comparator COMP1. The comparator COMP1 has an input connected to the data output of the pointer PO, a data input connected to an output of the register RP1, and a data output connected to the input of the register RD. The circuit COMP1 compares the number $I_i$ given by the pointer PO with the contents of the register RP1, and the comparison of the result, 0 or 1, is stored in the register RD.

The general operation of the generator according to the invention is similar to that of a known prior art generator. Initially, the number $E'_0=128$ (in the case of a sine wave such as the one shown here) contained in the memory MR is loaded into the comparison register RC. The pointer PO gives the number $I_0=0$. The counter CPC is set at 0 and starts counting the pulses of the clock signal CP.

Since $I_0 \neq 9$, a logic 0 is stored in the register RD. Furthermore, the circuit CPT compares the number NB given by the counter CPC with the word $MC_0$="0 $E'_0$" and gives SC=1. Since the inequality $NB<MC_0$ is verified, the signal SC remains at 1. When the number NB reaches the value $MC_0$, at approximately the half-period of the counter, the signal SC goes to 0. The cyclical ratio of this signal is then equal, for this period of the counter, to about 50%.

After having reached its maximum value NBMAX=255, the counter CPC returns to 0 during the next pulse of the clock signal CP. The pointer then gives the number $I_1=1$ in this example. Since $I_1 \neq 9$, the contents of the register RD remains unchanged, i.e., equal to 0. Furthermore, the number $E'_1$, equal to about 150, is loaded into the comparison register RC, and the comparator compares the number NB given by the counter CPC with the word $E_1$="0 $E'_1$". It then gives SC=1 so long as NB<0, then SC=0. The cyclical ratio of this signal is then equal, for this period, to about 59%.

After having reached its maximum value NBMAX=255, the counter CPC returns to 0 during the next pulse of the clock signal CP, then continues to count. Thus, at each passage to 0 of the counter, the numbers $I_0$, $I_1$, $I_2$, etc. are successively given by the pointer PO. At the same time, the numbers $E'_0$, $E'_1$, $E'_2$, etc. are successively loaded into the comparison register RC. The comparison in the circuit CPT is carried out continuously and the signal SC is produced according to the changes of the numbers Ei (according to the changes in the amplitude of the reference signal).

A time comes when the pointer PO gives the number $I_9=9$. In this case, a logic 1 is stored in the register RD. Furthermore, the corresponding number $E'_9=0$ is loaded into the comparison register RC, and the comparator compares the number NB given by the counter CPC with the word $E_1=$"1 $E'_9$" equal to 256. It then gives SC=1 throughout the cycle of the counter since the inequality NB<0 is always verified. The cyclical ratio of this signal is always equal, for this period, to 100%. Operation of the generator then continues as above.

With the invention and as in the prior art circuits, the N-bit number NB given by the counter is compared with an N+1 bit number. This gives a cyclical ratio of 0 to 100% for the signal SC. In the invention, all the bits of the counter CPC will be used. This gives optimum precision for the size M of this counter CPC. Only one comparison register RC having the same size N as the counter CPC is used to store the reference samples. Only one loading register is therefore necessary at each passage to zero of the counter to store the samples and prepare the comparison.

Variations or improvements of the generator according to FIG. 3 can easily be planned, alone or in combination with one another. For example, the basic elements of the circuit (counter, registers, etc.) are eight-bit elements. It is possible to use differently sized elements, for example, 12-bit or 16-bit elements.

The invention is, however, more advantageous when the register RC and the counter CPC used are identically sized. This enables the use of all the bits of the counter while at the same time using only one comparison register RC.

In another variation, the number of samples NBECH may be modified. In the example described, the number NBECH has been chosen to be equal to any other value, 1000, $2^8$, $2^{16}$, etc. The choice of the number of samples is generally a compromise between the precision of the generator. That is, the greater the number of samples, the closer are the variations of the signal SC to the variations in the amplitude of the reference signal, and the more precise is the control of the motor. There may also be a compromise in the computation time which increases rapidly with the number of samples, and the size of the memory MR (and therefore that of the total circuit), which too increases with the number of samples.

Of course, the pointer PO must be adapted accordingly. Its size must be sufficient to enable the processing of the numbers sized $2^8$, $2^{16}$ as the case may be. Similarly, the elements of the circuit CTEST must be adapted accordingly, and especially the parameter PARA must be modified. In the case of an initial analog signal such as that of FIG. 1$a$ and a pointer with an increment of 1, the parameter PARA=64 if NBECH=$2^8$, and PARA=16384 if NBECH=$2^{16}$.

In yet another variation, the pointer PO may be chosen differently. In the example described with reference to FIG. 3, the pointer gives numbers incremented by 1: $I_0=0$, $I_1=1$, etc. However, it is quite possible to choose another type of increment. For example, it is possible to use a pointer giving the numbers $I_0=0°$, $I_1=10°$, $I_2=20°$, ..., $I_{35}=350°$. It is equally possible to choose a pointer giving $I_0=2^8$, $I_1=2^8+2^8=2*2^8$, $I_2=3*2^8$, ..., $I_{255}=2^8*2^8=2^{16}$. Here too, depending on the pointer chosen, the circuit CTEST, and especially the parameter PARA, should be adapted accordingly.

In yet another variation, the initial analog signal used is different from a sine signal. Here too, depending on the initial analog signal chosen, the parameter PARA would have to be adapted accordingly, as also the circuit CTEST.

The analog signal may also be a sine signal (such as that of FIG. 1$a$) deformed by the addition of harmonics 3. In this case, the amplitude of the analog signal is the maximum for two phase values 60° and 120°; and it is the minimum for two phase values 240° and 300°. In this case, the parameter PARA is a set of two values: PARA1=6, and PARA2=12 if the number of samples is equal to 36 and if the increment of the pointer is equal to 1. The circuit CTEST is modified to take account of these two values, and to test if the number $I_i$ given by the pointer is equal to either of these values. If $I_i$ is equal to one of the values of the parameter PARA, then CTEST produces a logic 1, else its produces a logic 0.

The analog signal may also be a square-wave signal or a trapezoidal signal. In this case, the amplitude of the analog signal is the maximum and constant at least between two phases Phi1 and Ph2. The parameter PARA then takes a set of values associated with the phases ranging from Ph1 to Ph2. For example, if Ph1=20° and Ph2=200°, the number of samples is equal to 36. If the increment of the pointer is equal to 1, then PARA is a set comprising the following numbers: 2, 3, 4, ..., 19, 20. The circuit CTEST is obviously modified to take account of all these values in comparing the number $I_i$ with all these values.

In any case, the parameter PARA, which is a number, or possibly a set of numbers, is chosen as a function of the number of samples NBECH, the type of increment used for the pointer, and the shape of the initial analog signal.

In yet another variation, the counter CPC used is different from the counter used in the example. The counter can also give numbers decreasing from its maximum value NBMAX to the value 0, then return to NBMAX and continue to count down. The counter can also give numbers increasing from 0 to its maximum value NBMAX and then give numbers decreasing to 0.

Regardless of the counter chosen, the overall operation of the generator is similar. The comparator CPT is adapted to verifying the adequate inequality: NB≧E'i or NB≦E'i or again NB≧E'i only when the numbers NB change in an upward (or downward) direction, depending on the counter CPC chosen.

The generator may also be improved by the addition of means to modulate the amplitude of the sampled, reference signal SREF used. With this improvement, it is possible to produce control signals of variable amplitude. Thus, the power given to the element (motor, pump, etc.) controlled by this signal is modulated.

The means for the amplitude modulation of the reference signal comprise an index register RI and a multiplier MULT shown in dashes in FIG. 3. Furthermore, the counter is replaced by an N+N' bit counter, the register RC is replaced by an N+N' bit register, and the circuit CTEST is modified.

The index register is an N' bit register in which an amplitude modulation parameter MA is stored. This parameter MA may be modified by means external to the circuit, but remains preferably constant throughout the period of the sampled reference signal. The number N' may be equal to the number N, but not necessarily so.

The multiplier MULT is a multiplication circuit adapted to the multiplication of the N-bit numbers $E_0$ to $E_{NBECH}$ to give a result of N+N'. The N-bit numbers $E_0$ to $E_{NBECH}$ are stored in the memory MR by the modulation parameter MA which is stored in the index register RI. The multiplier MULT comprises a data input connected to an N-bit data output of the memory MR, a data input connected to the output of the N-bit register RI, and a data output connected to the data input of the comparison register RC. The direct link between the memory MR and the register RC is, in this case, eliminated.

The circuit CTEST is modified by the addition of a comparator COMP2, a register RP2 and a gate OP, shown by the dashed lines in FIG. 4. The register RP2 has a size N' suited to memorizing a predefined value MA0 of the amplitude modulation parameter MA. The value MA0 is, for example, the maximum value that can be taken by the parameter MA.

The comparator COMP2 comprises an input connected to the data output of the register RI, a data input connected to an output of the register RP2 and a data output connected to an input of the AND type logic gate OP, another input of which is connected to the output of the comparator COMP1. The output of the gate OP is connected to the input of the register RD.

The circuit COMP1 compares the number $I_i$ given by the pointer PO with the contents of the register RP, and the result of the comparison. In parallel, the circuit COMP2 compares the value of the parameter MA with the value MA0 contained in the register RP2. The results given by COMP1, COMP2 are combined by the gate OP and the result of the combination is stored in the register RD.

That which is claimed is:

1. A method for generating a pulse-width-modulated signal from a reference signal, the method comprising:
   incrementing a counter at each pulse of a clock signal to produce a number;
   updating a reference number related to the reference signal each time the counter reaches a setting value;
   comparing a pointer value with a reference parameter to compute an overflow bit, the pointer value being updated each time the counter reaches the setting value; and
   comparing the number given by the counter with an updated comparison word comprising, in most significant bits, the computed overflow bit, and in least significant bits, the updated reference number for generating the pulse-width-modulated signal.

2. A method according to claim 1, wherein the number produced by the counter and the updated reference number have a same size.

3. A method according to claim 1, wherein the updated comparison word is a sample of the reference signal associated with the updated pointer value.

4. A method according to claim 1, wherein updating the reference number comprises eliminating the most significant bits of a sample of the reference signal associated with the updated pointer value.

5. A method according to claim 1, wherein updating the reference number comprises multiplying an updated initial number by an amplitude modulation parameter, the updated initial number being obtained by eliminating the most significant bits of a sample of the reference signal associated with the updated pointer value.

6. A method according to claim 1, wherein the reference parameter is a pointer value for which a sample of the reference signal has a maximum amplitude.

7. A method according to claim 1, wherein the reference parameter comprises a plurality of pointer values for which each sample of the reference signal has a maximum amplitude.

8. A pulse-width-modulated (PWM) signal generator comprising:
   a counter having an input for receiving a clock signal, and an output for providing a number that is incremented at each pulse of the clock signal;
   a comparison register having an input for receiving a reference number related to a reference signal, the reference number being updated each time said counter reaches a setting value;
   a test circuit having an input for receiving a pointer value, and comparing the pointer value with a reference parameter to compute an overflow bit, the pointer value being updated each time said counter reaches the setting value;
   an overflow register having an input connected to said test circuit for storing the computed overflow bit; and
   a comparator having a first input connected to said counter, a second input connected to said comparison register, and a third input connected to said overflow register for comparing the number given by said counter with an updated comparison word comprising, in most significant bits, the computed overflow bit, and in least significant bits, the updated reference number for generating a pulse width-modulated signal.

9. A PWM signal generator according to claim 8, wherein the number produced by said counter and the updated reference number have a same size.

10. A PWM signal generator according to claim 8, wherein said test circuit comprises a first comparator having a first input for receiving the reference parameter, and a second input for receiving the updated pointer value.

11. A PWM signal generator according to claim 8, wherein said test circuit comprises software means for comparing the reference parameter with the updated pointer value.

12. A PWM signal generator according to claim 8, further comprising a reference memory having a control input connected to said counter for storing the reference numbers.

13. A PWM signal generator according to claim 12, wherein said reference memory has a data output connected to a data input of said comparison register.

14. A PWM signal generator according to claim 13, further comprising:
   an index register for storing an amplitude modulation parameter; and
   a multiplication circuit having a first input connected to an output of said index register, a second input connected to the data output of said reference memory, and an output connected to the data input of said comparison register.

15. A combination of a motor and at least one pulse-width-modulated (PWM) signal generator connected thereto, said at least one PWM signal generator comprising:
   a counter having an input for receiving a clock signal, and an output for providing a number that is incremented at each pulse of the clock signal;
   a comparison register having an input for receiving a reference number related to a reference signal, the reference number being updated each time said counter reaches a setting value;
   a test circuit having an input for receiving a pointer value, and comparing the pointer value with a reference parameter to compute an overflow bit, the pointer value being updated each time said counter reaches the setting value;

an overflow register having an input connected to said test circuit for storing the computed overflow bit; and a comparator having a first input connected to said counter, a second input connected to said comparison register, and a third input connected to said overflow register for comparing the number given by said counter with an updated comparison word comprising, in most significant bits, the computed overflow bit, and in least significant bits, the updated reference number for generating a pulse-width-modulated signal for controlling the motor.

16. A combination of a motor and at least one PWM signal generator according to claim 15, wherein the number produced by said counter and the updated reference number have a same size.

17. A combination of a motor and at least one PWM signal generator according to claim 15, wherein said test circuit comprises a first comparator having a first input for receiving the reference parameter, and a second input for receiving the updated pointer value.

18. A combination of a motor and at least one PWM signal generator according to claim 15, wherein said test circuit comprises software means for comparing the reference parameter with the updated pointer value.

19. A combination of a motor and at least one PWM signal generator according to claim 15, wherein the at least one PWM signal generator further comprises a reference memory having a control input connected to said counter for storing the reference numbers.

20. A combination of a motor and at least one PWM signal generator according to claim 19, wherein said reference memory has a data output connected to a data input of said comparison register.

21. A combination of a motor and at least one PWM signal generator according to claim 20, wherein the at least one PWM signal generator further comprises:

an index register for storing an amplitude modulation parameter; and a multiplication circuit having a first input connected to an output of said index register, a second input connected to the data output of said reference memory, and an output connected to the data input of said comparison register.

22. A combination of a motor and at least one PWM signal generator according to claim 15, the motor is monophase.

23. A combination of a motor and at least one PWM signal generator according to claim 15, wherein the motor is triphase; and wherein the at least one PWM signal generator comprises three PWM signal generators operating in parallel using a single counter.

* * * * *